(12) United States Patent
Sai et al.

(10) Patent No.: US 10,204,726 B2
(45) Date of Patent: Feb. 12, 2019

(54) BACKPLANE STRUCTURE AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Jiazuo Sai, Beijing (CN); Hetao Wang, Beijing (CN); Jianguo Xing, Beijing (CN); Jie Liu, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 373 days.

(21) Appl. No.: 15/159,229

(22) Filed: May 19, 2016

(65) Prior Publication Data
US 2017/0092404 A1 Mar. 30, 2017

(30) Foreign Application Priority Data
Sep. 30, 2015 (CN) .......................... 2015 1 0640481

(51) Int. Cl.
*H05K 5/00* (2006.01)
*H01F 7/06* (2006.01)
(Continued)

(52) U.S. Cl.
CPC ............... *H01F 7/064* (2013.01); *G02F 1/13* (2013.01); *G02F 1/133305* (2013.01);
(Continued)

(58) Field of Classification Search
CPC ....................................................... H01F 7/064
See application file for complete search history.

(56) References Cited

U.S. PATENT DOCUMENTS 4,280,756 A * 7/1981 Albertinetti ............ G02B 26/06
359/295
4,875,764 A * 10/1989 Marino ................... G02B 26/06
359/849
(Continued)

FOREIGN PATENT DOCUMENTS

| CN | 101517452 A | 8/2009 |
| CN | 103545340 A | 1/2014 |

(Continued)

OTHER PUBLICATIONS

First Office Action dated Mar. 20, 2017 in corresponding Chinese Application No. 201510640481.7.

*Primary Examiner* — Stephen W Jackson
(74) *Attorney, Agent, or Firm* — Nath, Goldberg & Meyer; Joshua B. Goldberg (57) ABSTRACT

The present invention provides a backplane structure and a display device including the backplane structure. The backplane structure includes a backplate, a plurality of support components provided on a side of the backplate, and a control unit, wherein each of the support components includes a signal receiving element and an executive element, the signal receiving element may receive a control signal sent by the control unit, and the executive element has one end fastened to the backplate and is capable of being contracted or extended when the control signal is received by the signal receiving element. The display device provided by the present invention can not only achieve flat display, but also achieve curved display with different curvatures.

11 Claims, 2 Drawing Sheets

(51) Int. Cl.
    *H05K 1/02*         (2006.01)
    *H01L 41/12*       (2006.01)
    *G02F 1/13*         (2006.01)
    *G02F 1/1333*     (2006.01)

(52) U.S. Cl.
    CPC ........... H01L 41/12 (2013.01); H05K 1/0296 (2013.01); H05K 5/0017 (2013.01); H05K 2201/083 (2013.01); H05K 2201/10083 (2013.01)

(56) References Cited

U.S. PATENT DOCUMENTS

| | | | | |
|---|---|---|---|---|
| 4,944,580 | A * | 7/1990 | MacDonald | G02B 26/06 250/201.1 |
| 7,125,129 | B2 * | 10/2006 | Oshima | G02B 7/183 359/849 |
| 2008/0049389 | A1 | 2/2008 | Kim | |
| 2008/0192416 | A1 | 8/2008 | Kim | |
| 2011/0149408 | A1 | 6/2011 | Hahgholt et al. | |
| 2013/0301113 | A1 * | 11/2013 | Pellegrino | G02B 26/08 359/298 |
| 2014/0015402 | A1 | 1/2014 | Ahn et al. | |
| 2014/0098075 | A1 | 4/2014 | Kwak et al. | |

FOREIGN PATENT DOCUMENTS

| | | |
|---|---|---|
| CN | 104536162 A | 4/2015 |
| CN | 104781778 A | 7/2015 |
| EP | 1754129 A1 | 2/2007 |
| EP | 1891498 A1 | 2/2008 |

* cited by examiner

BACKPLANE STRUCTURE AND DISPLAY DEVICE

FIELD OF THE INVENTION

The present invention relates to the field of display technology, and particularly, relates to a backplane structure and a display device including the backplane structure.

BACKGROUND OF THE INVENTION

With the development of the display technology, demands for display devices have been increasing. Currently, the curved surface display technology has entered people's life, and bears extensive attentions. Entire screen of a curved display device is designed to be arc-shaped, which can provide a panoramic image to users, and thus can bring better visual enjoyment to users.

In an existing curved display device, a display panel is fastened mainly in a mechanically fastening manner, for example, by using a front frame to constrain the display panel after bending left and right sides of the display panel forward, or, by fastening the display panel, after left and right sides of the display panel is bent forward, to a light guide plate or other fastening structure with the same curvature. In this mechanically fastening manner, once manufacturing process of the curved display device is completed, the curvature of the display surface of the curved display device is fixed and unadjustable, and the device even cannot return to a flat display state.

SUMMARY OF THE INVENTION

An object of the present invention is to provide a backplane structure and a display device including the backplane structure, such that the display surface of the display device could be switched among a flat surface and curved surfaces of different curvatures.

As an aspect of the present invention, there is provided a backplane structure, the backplane structure includes a backplate, a plurality of support components provided on a side of the backplate, and a control unit, each of the support components includes a signal receiving element and an executive element, the signal receiving element could receive a control signal sent by the control unit, and the executive element has one end fastened to the backplate and is capable of being contracted or extended when the control signal is received by the signal receiving element.

Optionally, the signal receiving element includes a first electrode and a second electrode which are insulated and spaced apart from each other, the executive element includes a support pillar made of an electrostrictive material, the support pillar has two ends respectively connected to the first electrode and the second electrode, the second electrode is fastened to the backplate;

the control unit includes a first control circuit and a second control circuit, the control signal includes a first control voltage signal provided to the first electrode by the first control circuit, and a second control voltage signal provided to the second electrode by the second control circuit, and the first control voltage signal is different from the second control voltage signal, so that an electric field is generated between the first electrode and the corresponding second electrode.

Optionally, the signal receiving element includes a first electrode, a second electrode, and a solenoid, the first electrode and the second electrode are insulated and spaced apart from each other, the solenoid has two ends respectively connected to the first electrode and the second electrode, the executive element includes a support pillar made of a magnetostrictive material, the solenoid encircles the support pillar, and the solenoid and the support pillar are insulated and spaced apart from each other, the support pillar has two ends respectively connected to the first electrode and the second electrode through insulators, and the second electrode is fastened to the backplate;

the control unit includes a first control circuit and a second control circuit, the control signal includes a first control voltage signal provided to the first electrode by the first control circuit, and a second control voltage signal provided to the second electrode by the second control circuit, and the first control voltage signal is different from the second control voltage signal, so that a magnetic field is generated in an area encircled by the solenoid.

Optionally, the plurality of support components are arranged in rows and columns, the backplane structure further includes a plurality of first signal transmission lines and a plurality of second signal transmission lines, the first signal transmission lines and the second signal transmission lines are insulated and spaced apart from each other, the support components in each row correspond to one of the first signal transmission lines, the support components in each column correspond to one of the second signal transmission lines, the first electrodes of the support components in each row are connected to the first control circuit through a corresponding first signal transmission line, and the second electrodes of the support components in each column are connected to the second control circuit through a corresponding second signal transmission line.

As another aspect of the present invention, there is provided a display device, the display device includes the above described backplane structure provided by the present invention and a display unit, the display unit is supported by the plurality of support component, and the other ends of the executive elements not fastened to the backplate are fixedly connected to a non-display surface of the display unit.

Optionally, the signal receiving element includes a first electrode and a second electrode which are insulated and spaced apart from each other, the first electrode is fastened to a surface of the display unit facing the backplate, and the second electrode is fastened to a surface of the backplate facing the display unit, the executive element includes a support pillar made of an electrostrictive material, the support pillar has two ends respectively connected to the first electrode and the second electrode;

the control unit includes a first control circuit and a second control circuit, the control signal includes a first control voltage signal provided to the first electrode by the first control circuit, and a second control voltage signal provided to the second electrode by the second control circuit, and the first control voltage signal is different from the second control voltage signal, so that an electric field is generated between the first electrode and the corresponding second electrode.

Optionally, the signal receiving element includes a first electrode, a second electrode, and a solenoid, the first electrode and the second electrode are insulated and spaced apart from each other, the first electrode is fastened to a surface of the display unit facing the backplate, and the second electrode is fastened to a surface of the backplate facing the display unit, the solenoid has two ends respectively connected to the first electrode and the second electrode, the executive element includes a support pillar made of a magnetostrictive material, the solenoid encircles the support pillar, and the solenoid and the support pillar are insulated and spaced apart from each other, the support pillar has two ends respectively connected to the first electrode and the second electrode through insulators;

the control unit includes a first control circuit and a second control circuit, the control signal includes a first control voltage signal provided to the first electrode by the first control circuit, and a second control voltage signal provided to the second electrode by the second control circuit, and the first control voltage signal is different from the second control voltage signal, so that a magnetic field is generated in an area encircled by the solenoid.

Optionally, the plurality of support components are arranged in rows and columns, the backplane structure further includes a plurality of first signal transmission lines and a plurality of second signal transmission lines, the first signal transmission lines and the second signal transmission lines are insulated and spaced apart from each other, the support components in each row correspond to one of the first signal transmission lines, the support components in each column correspond to one of the second signal transmission lines, the first electrodes of the support components in each row are connected to the first control circuit through a corresponding first signal transmission line, and the second electrodes of the support components in each column are connected to the second control circuit through a corresponding second signal transmission line.

Optionally, the display device further includes a retaining frame, which is provided around the backplate and is used for encapsulating the display unit and the backplate.

In the present invention, after a control signal is sent by the control unit, the signal receiving element receives the control signal, and the executive element is contracted or extended when the signal receiving element receives the control signal. Therefore, when the plurality of signal receiving elements receive identical control signals, the plurality of executive elements respectively corresponding thereto have identical heights after being contracted or extended, and the other ends of the plurality of executive elements which are not fastened to the backplate are in the same plane, and therefore the display surface of the display unit, which is fixedly connected to the other ends of the executive elements which are not fastened to the backplate, is a flat surface, so as to achieve flat display; when the plurality of signal receiving elements receive control signals which are not identical, the plurality of executive elements respectively corresponding thereto do not have identical heights after being contracted or extended, and the other ends of the plurality of executive elements which are not fastened to the backplate are in a curved surface, and therefore the display surface of the display unit, which is fixedly connected to the other ends of the executive elements which are not fastened to the backplate, is a curved surface, so as to achieve curved display. In addition, by controlling the control signal sent by the control unit, height differences could be produced between different executive elements, thereby controlling the curvature of the display surface of the display unit, which is fixedly connected to the other ends of the executive elements which are not fastened to the backplate. It can be seen that, with the backplane structure provided by the present invention, the display unit can not only achieve flat display, but also achieve curved display with different curvatures, so as to provide users with different options to meet different demands of the users.

BRIEF DESCRIPTION OF THE DRAWINGS

The accompanying drawings, which constitute a part of the specification, are provided for further understanding of the present invention, and for explaining the present invention along with the following specific implementations, but not intended to limit the present invention, in which.

DETAILED DESCRIPTION OF THE EMBODIMENTS

The specific implementations of the present invention will be described in detail below in conjunction with the drawings. It should be understood that specific implementations to be described herein are merely used for illustrating and interpreting the present invention and not for limiting the present invention.

Figure 1:
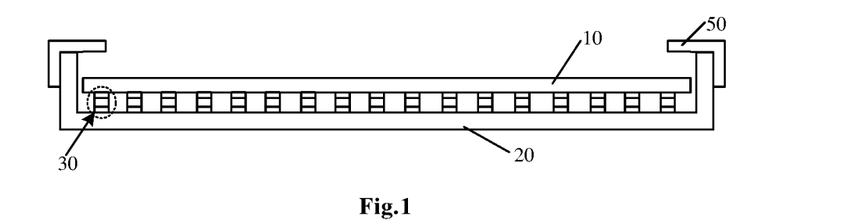
FIG. 1 is a schematic diagram of a display device, in a flat state, provided by an implementation of the present invention.
Figure 2:
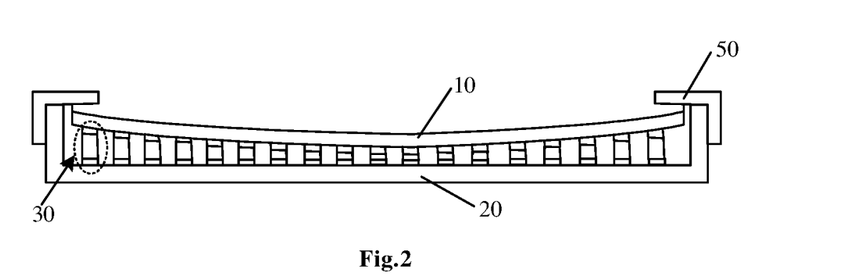
FIG. 2 is a schematic diagram of the display device, in a curved state, provided by an implementation of the present invention.

As an aspect of the present invention, there is provided a backplane structure, as shown in FIGS. 1 and 2, the backplane structure includes a backplate 20, a plurality of support components 30 disposed on one side of the backplate 20, and a control unit (not illustrated). Each of the support components 30 includes a signal receiving element and an executive element (the signal receiving element and the executive element of one support component 30 correspond to each other), the signal receiving element can receive a control signal sent by the control unit, and the executive element has one end fastened to the backplate 20, and can be contracted or extended when the signal receiving element receives the control signal.

The backplane structure provided by the present invention could be applied to a display device to support a display unit which can display independently. After a control signal is sent by the control unit, the control signal is received by a signal receiving element, and a corresponding executive element is contracted or extended when the signal receiving element receives the control signal. Therefore, when a plurality of signal receiving elements receive identical control signals, a plurality of executive elements respectively corresponding thereto have identical heights after being contracted or extended, and the other ends of the plurality of executive elements which are not fastened to the backplate 20 are in the same plane, and therefore a display surface of the display unit, which is fixedly connected to the other ends of the executive elements which are not fastened to the backplate 20, is a flat surface, so as to achieve flat display; when the plurality of signal receiving elements receive control signals which are not identical, the plurality of executive elements respectively corresponding thereto do not have identical heights after being contracted or extended, and the other ends of the plurality of executive elements which are not fastened to the backplate 20 are in a curved surface, and therefore the display surface of the display unit, which is fixedly connected to the other ends of the executive elements which are not fastened to the backplate 20, is a curved surface, so as to achieve curved display. In addition, by controlling the control signal sent by the control unit, height differences could be produced between different executive elements, thereby controlling the curvature of the display surface of the display unit, which is fixedly connected to the other ends of the executive elements which are not fastened to the backplate 20. It can be seen that, with the backplane structure provided by the present invention, the display unit can not only achieve flat display, but also achieve curved display with different curvatures, so as to provide users with different options to meet different demands of the users.

Figure 3:
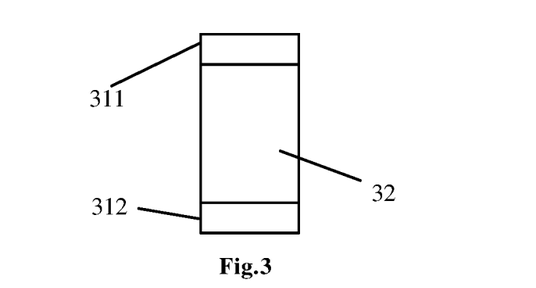
FIG. 3 is a schematic diagram of a structure of a first example of a support component of a backplane structure provided by an implementation of the present invention.
Figure 5:
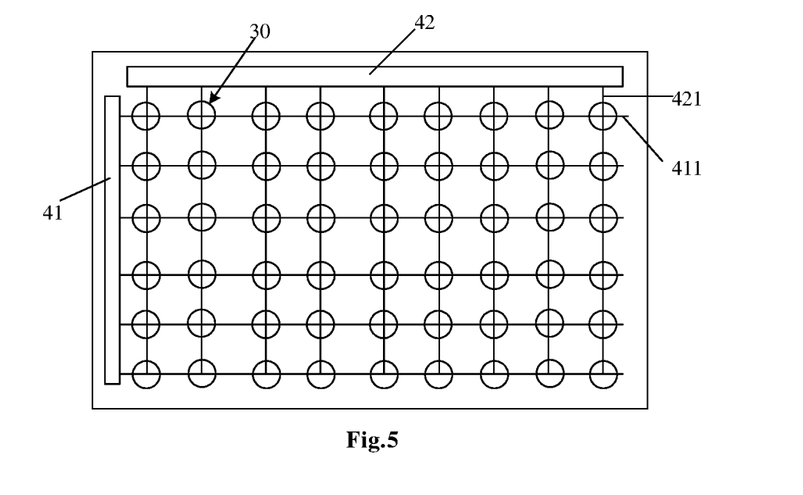
FIG. 5 is a top view of a backplane structure provided by an implementation of the present invention.

In an implementation of the present invention, as shown in FIG. 3, in the support component 30, the signal receiving element includes a first electrode 311 and a second electrode 312 which are insulated and spaced apart from each other (the first electrode 311 and the second electrode 312 in one signal receiving element correspond to each other), the executive element includes a support pillar 32 made of an electrostrictive material (such as a polyurethane macromolecule polymer, a perovskite ceramic material, or the like), the support pillar 32 has two ends respectively connected to the first electrode 311 and the second electrode 312, and the second electrode 312 is fastened to the backplate 20. As shown in FIG. 5, the control unit includes a first control circuit 41 and a second control circuit 42, the control signal includes a first control voltage signal provided to the first electrode 311 by the first control circuit 41, and a second control voltage signal provided to the second electrode 312 by the second control circuit 42, the second control voltage signal may be different from the first control voltage signal, so that an electric field could be generated between the first electrode 311 and the corresponding second electrode 312, and a strength of the electric field corresponds to the difference between the first control voltage signal received by the first electrode 311 and the second control voltage signal received by the second electrode 312. Preferably, the first electrode 311 and the second electrode 312 in each of the signal receiving elements may be disposed opposite to each other, so that the electric field generated therebetween is stronger.

One end of the support pillar 32 is fixedly connected to the backplate 20 through the second electrode 312, and the other end of the support pillar 32 may be fixedly connected to the display unit through the first electrode 311. When no voltage signal is applied to at least one of the first electrode 311 and the second electrode 312, or identical voltage signals are applied to the first electrode 311 and the second electrode 312 (that is, the second control voltage signal is identical to the first control voltage signal), no electric field will be generated between the first electrode 311 and the second electrode 312, and thus the support pillar 32 keeps its initial height. When different voltage signals are respectively applied to the first electrode 311 and the second electrode 312 (that is, the second control voltage signal is different from the first control voltage signal), an electric field is generated between the first electrode 311 and the second electrode 312. Under the effect of the electric field, the support pillar 32 made of an electrostrictive material is extended or contracted. In particular, when the direction of the electric field is from top to bottom (that is, from the first electrode 311 to the second electrode 312), the support pillar 32 is contracted; when the direction of the electric field is from bottom to top (that is, from the second electrode 312 to the first electrode 311), the support pillar 32 is extended. Moreover, the stronger the electric field is, the more the support pillar 32 is extended or contracted. When the support pillars 32 at different positions are extended or contracted to different extents, the display surface of the display unit supported by the plurality of support components 30 can be curved. By adjusting the strength of the electric field between the first electrode 311 and the second electrode 312 of each of the signal receiving elements, the curvature of the display surface of the display unit can be adjusted.

Figure 4:
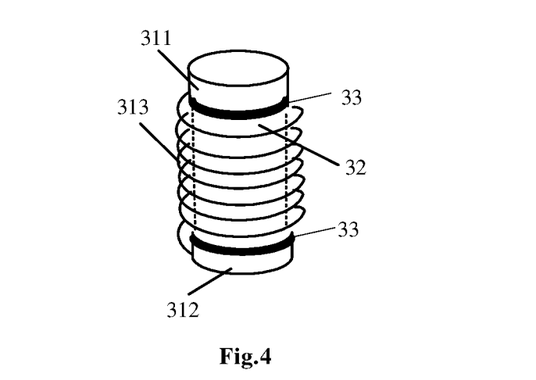
FIG. 4 is a schematic diagram of a structure of a second example of a support component of the backplane structure provided by an implementation of the present invention.

In another implementation of the present invention, as shown in FIG. 4, in the support component 30, the signal receiving element includes a first electrode 311, a second electrode 312, and a solenoid 313, the first electrode 311 and the second electrode 312 are insulated and spaced apart from each other, and the solenoid 313 has two ends respectively connected to the first electrode 311 and the second electrode 312. The executive element includes a support pillar 32 made of a magnetostrictive material, the solenoid 313 encircles the support pillar 32, the solenoid 313 and the support pillar 32 are insulated and spaced apart from each other, the support pillar 32 has two ends respectively connected to the first electrode 311 and the second electrode 312 through insulators 33, and the second electrode 312 is fastened to the backplate 20. Similar to the above implementation, as shown in FIG. 5, the control unit includes a first control circuit 41 and a second control circuit 42, the control signal includes a first control voltage signal provided to the first electrode 311 by the first control circuit 41, and a second control voltage signal provided to the second electrode 312 by the second control circuit 42, the second control voltage signal may be different from the first control voltage signal, and in this case, the difference between the first control voltage signal and the second control voltage signal causes an electric current to flow through the first electrode 311, the second electrode 312 and the solenoid 313, so that a magnetic field is generated in an area encircled by the solenoid 313.

When a magnetic field is generated in the area encircled by the solenoid 313, under the effect of the magnetic field, the support pillar 32 made of a magnetostrictive material is extended or contracted. In particular, when the direction of the magnetic field is from bottom to top (that is, from the second electrode 312 to the first electrode 311), the support pillar 32 is extended, and the stronger the magnetic field is, the more the support pillar 32 is extended; when the direction of the magnetic field is from top to bottom (that is, from the first electrode 311 to the second electrode 312), the support pillar 32 is contracted, and the stronger the magnetic field is, the more the support pillar 32 is contracted. The greater the height difference between support pillars 32 located in the center region of the backplate 20 and support pillars 32 located at two sides of the backplate 20, the greater the curvature of the curved surface on which the other ends of the plurality of support pillars 32 not fastened to the backplate 20 are located. Therefore, the strength of the magnetic field at any location could be controlled by controlling a magnitude of the electric current flowing through the first electrode 311, the second electrode 312 and the solenoid 313 of the signal receiving element at that location, so as to control the height of the support pillar 32 at that location, and to further control the curvature of the curved surface on which the other ends of the plurality of support pillars 32 not fastened to the backplate 20 are located. In other words, when the other ends of the plurality of support pillars 32 not fastened to the backplate 20 have a display unit supported thereon and fixed thereto, the curvature of the display surface of the display unit could be controlled by controlling a magnitude of the electric current flowing through each group of the first electrode 311, the second electrode 312 and the solenoid 313. It could be understood that the support pillar 32 is restored to its initial height when the voltage signal is removed from the first electrode 311 and/or the second electrode 312.

In particular, the magnetostrictive material may be a Tb—Dy—Fe material (terbium-dysprosium-ferrum material).

As shown in FIG. 5, the plurality of support components 30 are arranged in rows and columns, the backplane structure further includes a plurality of first signal transmission lines 411 and a plurality of second signal transmission lines 421, and the first signal transmission lines 411 and the second signal transmission lines 421 are insulated and spaced apart from each other. In order to facilitate the control unit to provide a control signal to each of the signal receiving elements, in the implementations of the present invention, the support components 30 in each row correspond to one of the first signal transmission lines 411, the support components 30 in each column correspond to one of the second signal transmission lines 421, the first electrodes 311 of the support components 30 in each row are connected to the first control circuit 41 through a corresponding first signal transmission line 411, and the second electrodes 312 of the support components 30 in each column are connected to the second control circuit 42 through a corresponding second signal transmission line 421. The first control circuit 41 may output respective first control voltage signals to the first electrodes 311 of the plurality of support components through the plurality of first signal transmission lines 411, respectively; meanwhile, the second control circuit 42 may output respective second control voltage signals to the second electrodes 312 of the plurality of support components through the plurality of second signal transmission lines 421, respectively, so that respective electric fields or magnetic fields are generated between the first electrodes 311 and the second electrodes 312 of the plurality of support components at the same time, thereby controlling heights of the plurality of support pillars 32 to cause the other ends (that is, the ends far from the backplate 20) of the plurality of executive elements to be in a curved surface of a certain curvature.

It could be understood that, the above-described "first control voltage signal" does not refer to a specific signal value, but is a general term for a voltage signal provided by the first control circuit; likewise, the above-described "second control voltage signal" is a general term for a voltage signal provided by the second control circuit. Here, a strength of an electric field or a magnetic field between a first electrode 311 and a second electrode 312 is determined based on the extent to which each of the support pillars needs to be extended or contracted, so as to determine values of the plurality of first control voltage signals to be provided to the plurality of first signal transmission lines 411 and values of the plurality of second control voltage signals to be provided to the plurality of second signal transmission lines 421, and the value of the first control voltage signal applied to a first electrode 311 may be different from that of the second control voltage signal applied to the corresponding second electrode 312.

In general, during curved display, the curved surface defined by the display surface of the display unit may be regarded as a portion of a side surface of a cylinder. Therefore, in the present invention, when the other ends (that is, the ends far from the backplate 20) of the plurality of executive elements are located at a curved surface with a certain curvature, the heights of the support pillars 32 of a plurality of support components 30 in a same column are identical. In other words, strengths of the electric fields or magnetic fields between the first electrodes 311 and the second electrodes 312 of the plurality of support components 30 in the same column are identical. When controlling the height of each of the support pillars 32, the first control circuit 41 may simultaneously output identical first control voltage signals to the first electrodes 311 of the support components 30 in respective rows through the plurality of first signal transmission lines 411, so that the first electrodes 311 of all support components 30 have identical voltage signals applied thereto; meanwhile, the second control circuit 42 may simultaneously output the second control voltage signals, corresponding to the strengths of the electric fields or magnetic fields required for respective columns (that is, the support components 30 in respective columns), to the second electrodes 312 of the support components 30 in the respective columns through the plurality of second signal transmission lines 421, so that the second electrodes 312 of the support components 30 in each column have a voltage signal corresponding to the strength of the electric field or magnetic field required for that column applied thereto, and therefore the support pillars 32 of the support components 30 in each column are extended or contracted by a corresponding length. Of course, the first control circuit 41 may also sequentially output the first control voltage signals to the first electrodes 311 of the support components 30 in respective rows through the plurality of first signal transmission lines 411. In this case, when the first control voltage signal is outputted to the first electrodes 311 of the support components 30 in the M-th row through the M-th first signal transmission line 411, the first control voltage signal should also be continuously outputted to the first electrodes 311 of the support components 30 in the (M−1)-th row through the (M−1)-th first signal transmission line 411, to ensure the extended or contracted support pillars 32 can maintain their current heights.

In the above-described control manner, it is easy for the first control circuit 41 and the second control circuit 42 to provide the first electrodes 311 and the second electrodes 312 of the signal receiving elements with control signals, respectively. In addition, it is unnecessary for each first electrode 311 to be connected to the first control circuit 41 through a separate signal line, or, for each second electrode 312 to be connected to the second control circuit 42 through a separate signal line, thereby simplifying the structure of the display device.

The second electrode 312 may be directly connected to the second signal transmission line 421 to directly receive the second control voltage signal provided by the second control circuit 42, and of course, it may also be indirectly connected to the second signal transmission line 421. For example, a plurality of field effect transistors may be provided, such that each support component 30 corresponds to one field effect transistor, and a gate of the field effect transistor is connected to the corresponding first signal transmission line 411, a source thereof is connected to the corresponding second signal transmission line 421, and a drain thereof is connected to the second electrode 312 of the corresponding support component. When the first control circuit 41 provides the first control voltage signal to the first electrode 311 of the support component, the corresponding field effect transistor is turned-on, so that the second control voltage signal provided by the second control circuit 42 is received by the second electrode 312 of the support component. It should be noted that, in this case, the first control voltage signal is not only used as a turn-on voltage signal of the field effect transistor but also used to control the electric field or magnetic field generated between the first electrode and the second electrode. Therefore, when the display surface of the display unit is controlled to be a curved surface with a certain curvature, the first control voltage signal provided to the first electrode of each support component should be greater than the turn-on voltage of the field effect transistor.

It should be understood that the arrangement of the plurality of support components, the connection of the plurality of support components to the control unit, and the way to control the plurality of support components, and so on are not limited to the implementations described herein. Any arrangement, connection and control of the plurality of support components would be possible, as long as the ends of the plurality of support components not fastened to the backplate could be either in a flat plane or in a curved surface, and the display surface could be switched among a flat surface and curved surfaces of different curvatures.

As another aspect of the present invention, there is provided a display device including the above-described backplane structure provided by the present invention and a display unit, as shown in FIGS. 1 and 2, the display unit 10 is supported by the plurality of support components 30, and the other ends of the executive elements not fastened to the backplate 20 are fixedly connected to a non-display surface of the display unit, so that when some of the executive elements are extended, portions of the display unit connected with these executive elements are pushed up, and when some of the executive elements are contracted, portions of the display unit connected with these executive elements are pulled down.

In particular, as described in one of the above implementations, the signal receiving element includes the first electrode 311 and the second electrode 312 which are insulated and spaced apart from each other, the executive element includes the support pillar 32 made of an electrostrictive material, the support pillar 32 has two ends respectively connected to the first electrode 311 and the second electrode 312. The control unit includes the first control circuit 41 and the second control circuit 42, the control signal includes the first control voltage signal provided to the first electrode 311 by the first control circuit 41, and the second control voltage signal provided to the second electrode 312 by the second control circuit 42, and the second control voltage signal may be different from the first control voltage signal. In this case, the first electrodes 311 are fastened to a surface (that is, non-display surface) of the display unit 10 facing the backplate 20, and the second electrodes 312 are fastened to a surface of the backplate 20 facing the display unit 10, that is, one ends of the executive elements are connected to the backplate through the second electrodes 312, and the other ends of the executive elements are connected to the display unit through the first electrodes 311.

Optionally, as described in another implementation above, the signal receiving element includes the first electrode 311, the second electrode 312 and the solenoid 313, the first electrode 311 and the second electrode 312 are insulated and spaced apart from each other, and the solenoid 313 has two ends respectively connected to the first electrode 311 and the second electrode 312; the executive element includes the support pillar 32 made of a magnetostrictive material, the solenoid 313 encircles the support pillar 32, the solenoid 313 and the support pillar 32 are insulated and spaced apart from each other, and the support pillar 32 has two ends respectively connected to the first electrode 311 and the second electrode 312 through insulators 33. The control unit includes the first control circuit 41 and the second control circuit 42, and the control signal includes the first control voltage signal provided to the first electrode 311 by the first control circuit 41, and the second control voltage signal provided to the second electrode 312 by the second control circuit 42, so that a magnetic field is generated in the area encircled by the solenoid. In this case, the first electrodes 311 are fastened to the surface (that is, non-display surface) of the display unit 10 facing the backplate 20, and the second electrodes 312 are fastened to the surface of the backplate 20 facing the display unit 10.

As shown in FIG. 5, the plurality of support components 30 are arranged in rows and columns, the backplane structure further includes a plurality of first signal transmission lines 411 and a plurality of second signal transmission lines 421, and the first signal transmission lines 411 and the second signal transmission lines 421 are insulated and spaced apart from each other. The support components 30 in each row correspond to one of the first signal transmission lines 411, and the support components 30 in each column correspond to one of the second signal transmission lines 421, the first electrodes 311 of the support components 30 in each row are connected to the first control circuit 41 through a corresponding first signal transmission line 411, and the second electrodes 312 of the support components 30 in each column are connected to the second control circuit 42 through a corresponding second signal transmission line 421. The first control circuit 41 may output respective first control voltage signals to the first electrodes 311 of the plurality of support components through the plurality of first signal transmission lines 411, respectively; meanwhile, the second control circuit 42 may output respective second control voltage signals to the second electrodes 312 of the plurality of support components through the plurality of second signal transmission lines 421, respectively, so that respective electric fields or magnetic fields are generated between the first electrodes 311 and the second electrodes 312 of the plurality of support components simultaneously, and therefore heights of the support pillars of the plurality of support components are controlled to cause the display surface of the display unit to be a curved surface with a certain curvature.

Further, as shown in FIGS. 1 and 2, the display device further includes a retaining frame 50, which is provided around the backplate 20 and used for encapsulating the display unit 10 and the backplate 20.

In the present invention, the display unit 10 may be a display device that can display independently, for example, the display unit 10 may be a liquid crystal display unit including a liquid crystal display panel and a backlight source; or, the display unit 10 may be an organic light-emitting display unit including an organic light-emitting display panel.

In the backplane structure, since the other ends of the plurality of executive elements not fastened to the backplate may be in the same plane or in a curved surface with a certain curvature, when the control signals sent by the control unit to the signal receiving elements of the support components are varied, the other ends of the executive elements of the support components not fastened to the backplate may be in a curved surface with a varying curvature. Therefore, the display surface of the display unit can be not only formed to be a flat surface to achieve flat display, but also formed to be a curved surface with a variable curvature to achieve curved display, so as to meet different demands of users.

It can be understood that the foregoing implementations are merely exemplary implementations used for describing the principle of the present invention, but the present invention is not limited thereto. Those of ordinary skill in the art may make various variations and modifications without departing from the spirit and essence of the present invention, and these variations and modifications shall fall into the protection scope of the present invention.

The invention claimed is:

1. A backplane structure for a display device, comprising:
a backplate;
a control unit; and
a plurality of support components provided on a side of the backplate,
wherein each of the support components includes a first electrode and a second electrode which are insulated and spaced apart from each other, and a support pillar between the first electrode and the second electrode, the support pillar has two ends respectively connected to the first electrode and the second electrode, and the second electrode is fastened to the backplate,
wherein in response to control signals received by the first electrode and the second electrode from the control unit, the support pillar is contracted or extended.

2. The backplane structure according to claim 1, wherein the support pillar is made of an electrostrictive material;
the control unit includes a first control circuit and a second control circuit, the control signals include a first control voltage signal provided to the first electrode by the first control circuit, and a second control voltage signal provided to the second electrode by the second control circuit, and the first control voltage signal is different from the second control voltage signal, so that an electric field is generated between the first electrode and the corresponding second electrode.

3. The backplane structure according to claim 2, wherein the plurality of support components are arranged in rows and columns, the backplane structure further includes a plurality of first signal transmission lines and a plurality of second signal transmission lines, the first signal transmission lines and the second signal transmission lines are insulated and spaced apart from each other, the support components in each row correspond to one of the first signal transmission lines, the support components in each column correspond to one of the second signal transmission lines, the first electrodes of the support components in each row are connected to the first control circuit through a corresponding first signal transmission line, and the second electrodes of the support components in each column are connected to the second control circuit through a corresponding second signal transmission line.

4. The backplane structure according to claim 1, wherein each of the support components further includes a solenoid, the solenoid has two ends respectively connected to the first electrode and the second electrode, the support pillar is made of a magnetostrictive material, the solenoid encircles the support pillar, and the solenoid and the support pillar are insulated and spaced apart from each other, and the support pillar has two ends respectively connected to the first electrode and the second electrode through insulators;
the control unit includes a first control circuit and a second control circuit, the control signals include a first control voltage signal provided to the first electrode by the first control circuit, and a second control voltage signal provided to the second electrode by the second control circuit, and the first control voltage signal is different from the second control voltage signal, so that a magnetic field is generated in an area encircled by the solenoid.

5. The backplane structure according to claim 4, wherein the plurality of support components are arranged in rows and columns, the backplane structure further includes a plurality of first signal transmission lines and a plurality of second signal transmission lines, the first signal transmission lines and the second signal transmission lines are insulated and spaced apart from each other, the support components in each row correspond to one of the first signal transmission lines, the support components in each column correspond to one of the second signal transmission lines, the first electrodes of the support components in each row are connected to the first control circuit through a corresponding first signal transmission line, and the second electrodes of the support components in each column are connected to the second control circuit through a corresponding second signal transmission line.

6. A display device, comprising:
the backplane structure of claim 1; and
a display unit,
wherein the display unit is supported by the plurality of support components, and the first electrode is fixedly connected to a non-display surface of the display unit.

7. The display device according to claim 6, wherein the second electrode is fastened to a surface of the backplate facing the display unit, the support pillar is made of an electrostrictive material;
the control unit includes a first control circuit and a second control circuit, the control signals include a first control voltage signal provided to the first electrode by the first control circuit, and a second control voltage signal provided to the second electrode by the second control circuit, and the first control voltage signal is different from the second control voltage signal, so that an electric field is generated between the first electrode and the corresponding second electrode.

8. The display device according to claim 7, wherein the plurality of support components are arranged in rows and columns, the backplane structure further includes a plurality of first signal transmission lines and a plurality of second signal transmission lines, the first signal transmission lines and the second signal transmission lines are insulated and spaced apart from each other, the support components in each row correspond to one of the first signal transmission lines, the support components in each column correspond to one of the second signal transmission lines, the first electrodes of the support components in each row are connected to the first control circuit through a corresponding first signal transmission line, and the second electrodes of the support components in each column are connected to the second control circuit through a corresponding second signal transmission line.

9. The display device according to claim 6, wherein the support component further includes a solenoid, and the second electrode is fastened to a surface of the backplate facing the display unit, the solenoid has two ends respectively connected to the first electrode and the second electrode, the support pillar is made of a magnetostrictive material, the solenoid encircles the support pillar, and the solenoid and the support pillar are insulated and spaced apart from each other, the support pillar has two ends respectively connected to the first electrode and the second electrode through insulators;
the control unit includes a first control circuit and a second control circuit, the control signals include a first control voltage signal provided to the first electrode by the first control circuit, and a second control voltage signal provided to the second electrode by the second control circuit, and the first control voltage signal is different from the second control voltage signal, so that a magnetic field is generated in an area encircled by the solenoid.

10. The display device according to claim 9, wherein the plurality of support components are arranged in rows and columns, the backplane structure further includes a plurality of first signal transmission lines and a plurality of second signal transmission lines, the first signal transmission lines and the second signal transmission lines are insulated and spaced apart from each other, the support components in each row correspond to one of the first signal transmission lines, the support components in each column correspond to one of the second signal transmission lines, the first electrodes of the support components in each row are connected to the first control circuit through a corresponding first signal transmission line, and the second electrodes of the support components in each column are connected to the second control circuit through a corresponding second signal transmission line.

11. The display device according to claim 6, further including a retaining frame, which is provided around the backplate and is used for encapsulating the display unit and the backplate.

* * * * *